(12) United States Patent
Seong et al.

(10) Patent No.: US 8,395,176 B2
(45) Date of Patent: Mar. 12, 2013

(54) TOP-EMITTING NITRIDE-BASED LIGHT-EMITTING DEVICE WITH OHMIC CHARACTERISTICS AND LUMINOUS EFFICIENCY

(75) Inventors: Tae-yeong Seong, Gwangju-si (KR);
Kyoung-kook Kim, Gyeonggi-do (KR);
June-o Song, Gwangju-si (KR);
Dong-seok Leem, Gwangju-si (KR);
Jung-inn Sohn, Gwangju-si (KR)

(73) Assignees: Samsung Electronics Co., Ltd. (KR);
Gwangju Institute of Science and Technology (KR)

( * ) Notice: Subject to any disclaimer, the term of this patent is extended or adjusted under 35 U.S.C. 154(b) by 352 days.

(21) Appl. No.: 11/076,249

(22) Filed: Mar. 10, 2005

(65) Prior Publication Data
US 2005/0199888 A1   Sep. 15, 2005

(30) Foreign Application Priority Data
Mar. 10, 2004   (KR) .................. 10-2004-0016271

(51) Int. Cl.
*H01L 33/00* (2010.01)
(52) U.S. Cl. .................. 257/99; 257/E33.065
(58) Field of Classification Search .......... 257/E33.065, 257/99
See application file for complete search history.

(56) References Cited

U.S. PATENT DOCUMENTS

| | | | | |
|---|---|---|---|---|
| 5,563,422 A | * | 10/1996 | Nakamura et al. | 257/13 |
| 5,609,907 A | * | 3/1997 | Natan | 427/2.12 |
| 5,990,500 A | * | 11/1999 | Okazaki | 257/99 |
| 6,194,743 B1 | * | 2/2001 | Kondoh et al. | 257/94 |
| 6,297,947 B1 | | 10/2001 | Howell et al. | |
| 6,326,294 B1 | * | 12/2001 | Jang et al. | 438/604 |

(Continued)

FOREIGN PATENT DOCUMENTS

| JP | 10-209500 A | 8/1998 |
|---|---|---|
| JP | 11-274562 | 10/1999 |

(Continued)

OTHER PUBLICATIONS

Yamada, M., et al., "InGaN-Based Near-Ultraviolet and Blue-Light-Emitting Diodes with High External Quantum Efficiency Using a Patterned Sapphire Substrate and a Mesh Electrode", Jpn. J. Appl. Phys, Dec. 15, 2002, vol. 41, p. 1431-3.*

(Continued)

*Primary Examiner* — Howard Weiss
(74) *Attorney, Agent, or Firm* — Cantor Colburn LLP

(57) ABSTRACT

A top-emitting nitride-based light-emitting device and a method of manufacturing the same. The top-emitting nitride-based light-emitting device having a substrate, an n-cladding layer, an active layer, and a p-cladding layer sequentially formed includes: a grid cell layer formed on the p-cladding layer by a grid array of separated cells formed from a conducting material with a width of less than 30 micrometers to improve electrical and optical characteristics; a surface protective layer that is formed on the p-cladding layer and covers at least regions between the cells to protect a surface of the p-cladding layer; and a transparent conducting layer formed on the surface protective layer and the grid cell layer using a transparent conducting material. The light-emitting device and the method of manufacturing the same provide an improved ohmic contact to the p-cladding layer, excellent I-V characteristics, and high light transmittance, thus increasing luminous efficiency of the device.

14 Claims, 2 Drawing Sheets

U.S. PATENT DOCUMENTS

| | | | |
|---|---|---|---|
| 6,465,808 B2 * | 10/2002 | Lin | 257/81 |
| 6,552,367 B1 * | 4/2003 | Hsieh et al. | 257/94 |
| 6,734,468 B2 * | 5/2004 | Uemura et al. | 257/99 |
| 6,787,383 B2 * | 9/2004 | Ikeda et al. | 438/44 |
| 6,924,163 B2 * | 8/2005 | Okazaki et al. | 438/46 |
| 6,933,191 B2 * | 8/2005 | Biery et al. | 438/239 |
| 2002/0063256 A1 | 5/2002 | Lin | |

FOREIGN PATENT DOCUMENTS

| | | |
|---|---|---|
| JP | 11-274562 A | 10/1999 |
| JP | 2003-142732 | 5/2003 |
| JP | 2003-142732 A | 5/2003 |

OTHER PUBLICATIONS

Y. C. Lin et al., "Nitride-Based Light-Emitting Diodes with Ni/Ito p-Type Ohmic Contacts", IEEE Photonics Technology Letters, vol. 14, No. 12, Dec. 2002, pp. 1668-1670.

Shyi-Ming Pan et al., "Enhanced Output Power of InGaN Light-Emitting Diodes with High-Transparency Nickel-Oxide-Indium-Tin-Oxide Ohmic Contacts", IEEE Photonics Technology Letters, vol. 15 No. 5, May 2003, pp. 646-648.

C. S. Chang et al., "InGaN/GaN Light-Emitting Diodes with ITO p-Contact Layers Prepared by RF Sputtering", Institute of Physics Publishing, Semiconductor Science and Technology, vol. 18, 2003 pp. L21-L23.

Japanese Office Action with English Translation for Application No. 2005068240 dated Feb. 1, 2011.

Final Rejection for JP2005-068240 issued on Aug. 23, 2011 by the Japanese Patent Office.

Japanese Office Action with English Translation for Application No. 101328 dated Sep. 11, 2012.

* cited by examiner

TOP-EMITTING NITRIDE-BASED LIGHT-EMITTING DEVICE WITH OHMIC CHARACTERISTICS AND LUMINOUS EFFICIENCY

CROSS-REFERENCE TO RELATED PATENT APPLICATION

This application claims the benefit of Korean Patent Application No. 10-2004-0016271, filed on Mar. 10, 2004, in the Korean Intellectual Property Office, the disclosure of which is incorporated herein in its entirety by reference.

BACKGROUND OF THE INVENTION

1. Field of the Invention

Embodiments of the present invention relate to a top-emitting nitride-based light-emitting device, and a method of manufacturing the same, and more particularly, to a top-emitting nitride-based light-emitting device with improved ohmic characteristics and luminous efficiency and a method of manufacturing the same.

2. Description of the Related Art

Transparent conducting thin films are used for a wide variety of applications in optoelectronics, display, and energy industries. In the field of light-emitting devices, research is being actively conducted around the world to develop a transparent conducting ohmic electrode structure that allows efficient hole injection and light emission.

Transparent conducting oxides (TCOs) and transparent conducting nitrides (TCNs) are currently attracting a great deal of interest. Typical examples of TCO are indium oxide ($In_2O_3$), tin oxide ($SnO_2$), zinc oxide (ZnO), and indium tin oxide (ITO). The most commonly used TCN is a titanium nitride (TiN). However, using only TCO or TCN film as a p-type transparent ohmic electrode for a top-emitting gallium nitride (GaN)-based light-emitting device may cause many problems since the TCO or TCN film exhibits high sheet resistance, high light reflectivity, and low work function under conditions for film formation.

The first problem is that the above-enumerated transparent conducting thin films are not suitable for use in large-area, large-capacity, and high-brightness light-emitting devices because their high sheet resistance of approximately 100 $\Omega/cm^2$ will hinder current spreading along a lateral direction (parallel to interlayer between layers) and vertical hole injection during film formation using physical vapor deposition (PVD) such as sputtering, electron-beam (e-beam) or heat evaporation, or pulsed laser deposition (PLD).

The second problem is that a p-GaN surface being exposed to plasma ions when the transparent conducting film is deposited using plasma can be easily damaged, thus degrading electrical characteristics.

The third problem is that the luminous efficiency of the transparent conducting film decreases due to its high reflectivity with respect to light emitted by a GaN-based light-emitting device.

The last problem is that when a TCO is used as an electrode in direct ohmic contact with a GaN-based compound semiconductor, insulating gallium oxide ($Ga_2O_3$) and magnesium oxide (MgO) are formed on the GaN surface during deposition of the thin film on the GaN due to the strong oxidizing power of Ga and Mg (a p-type dopant), thereby making it difficult to achieve a high quality ohmic contact electrode.

Meanwhile, light-emitting devices are classified into top-emitting light-emitting diodes (TLEDs) and flip-chip LEDs (FCLEDs). In commonly used TLEDs, light exits through an ohmic contact layer in contact with a p-cladding layer. However, due to the high sheet resistance of a p-cladding layer with a low hole concentration, a current spreading layer with a good current spreading capability is essentially required in order to achieve a high brightness TLED. That is, a current spreading layer with low sheet resistance and high light transmittance must be used as an ohmic contact layer to provide excellent hole injection, current spreading, and light emission.

TLEDs typically use a structure in which a nickel (Ni)/gold (Au) ohmic contact layer is formed on a p-cladding layer. The Ni/Au ohmic contact layer annealed in an oxygen ($O_2$) ambient has been known to have excellent specific contact resistivity of approximately $10^{-4}$ to $10^{-3}$ $\Omega cm^2$ and semi-transparency. When the conventional ohmic contact layer is annealed at temperature of 500 to 600° C. in an $O_2$ ambient, a nickel oxide (NiO) that is a p-type semiconductor oxide is formed on the island-like Au layer and between the Au layer and a p-GaN, thereby reducing a Schottky barrier height (SBH) at the interface between the p-GaN cladding layer and the Ni ohmic contact layer. Thus, holes that are majority carriers can be easily injected into the surface of the p-cladding layer.

Furthermore, annealing of the Ni/Au ohmic contact layer on the p-cladding layer results in disassociation of a Mg—H complex in GaN, which reactivates Mg dopants by increasing the concentration on the surface of GaN. As a result of reactivation, effective carrier concentration increases above 10 weight percent on the surface of the p-cladding layer. This causes tunneling conductance between the p-cladding layer and the ohmic contact layer containing NiO, thus achieving an ohmic contact with good ohmic conductance and low specific contact resistivity.

However, due to their low luminous efficiency, TLEDs using a semi-transparent Ni/Au ohmic contact layer suffer the limitation of not being able to realize the next generation light-emitting devices with large capacity and high brightness.

In a FCLED design, light is emitted through a sapphire substrate using a reflective layer in order to increase the amount of heat emitted during its operation as well as luminous efficiency. However, the FCLED also suffers from problems such as high resistance due to poor adhesion and oxidation of the reflective layer.

Thus, as a solution to overcome the limitations of TELDs and FCLEDs, the use of a TCO completely excluding Au, such as indium tin oxide (ITO), with superior light transmittance over a semi-transparent Ni (NiO)/Au used as a conventional p-ohmic contact layer, has been proposed in various literatures [IEEE PTL, Y. C. Lin, etc. Vol. 14, 1668 and IEEE PTL, Shyi-Ming Pan, etc. Vol. 15, 646]. The development of a TLED with an ITO ohmic contact layer exhibiting improved output power over a conventional one employing a Ni/Au ohmic contact has been recently discussed in a paper [Semicond. Sci. Technol., C S Chang, etc. 18 (2003), L21]. Furthermore, U.S. Pat. No. 6,297,947 proposes a method of fabricating a LED with improved light transmittance and electrical characteristics by combining thin oxidized Ni/Au or Ni/silver (Ag) with ITO. However, the proposed method is not suitable for use in high volume applications because of high specific contact resistivity and addition of the step of oxidizing the Ni/Au (or Ag).

As described above, there are the following fundamental problems that make it difficult to develop a high quality ohmic contact electrode.

First, a p-GaN has high sheet resistance above $10^4$ $\Omega/cm^2$ due to its low hole concentration.

Second, a SBH is increased at the interface between a p-GaN and an electrode due to the absence of a transparent electrode material having a work function higher than the p-GaN, thereby hindering vertical hole injection.

Third, like most materials having an inverse relationship between electrical and optical characteristics, transparent electrodes with high light transmittance have high sheet resistance, thereby significantly reducing lateral current spreading.

Fourth, insulating $Ga_2O_3$ and MgO are formed on a GaN surface when a transparent conducting layer is deposited directly on the p-GaN, thereby degrading electrical characteristics of a light-emitting device.

Fifth, the surface of a p-GaN can be easily damaged by plasma during sputtering that allows for formation of a transparent conducting layer with a low sheet resistance.

Due to the above-mentioned problems, the amount of heat generated between the p-GaN and the ohmic contact layer increases, thus decreasing the life span and reliability of a light-emitting device.

OBJECTS AND SUMMARY

Embodiments of the present invention provide a top-emitting nitride-based light-emitting device having a transparent ohmic contact electrode structure with high light transmittance, low sheet resistance, and low specific ohmic contact resistivity and a method of manufacturing the same.

According to an aspect of the present invention, there is provided a top-emitting nitride-based light-emitting device with an active layer between n- and p-type cladding layers, the device including: a grid cell layer formed on the p-cladding layer, the grid cell layer comprising a grid array of separated cells formed from a conducting material with a width of less than 30 micrometers; a surface protective layer that is formed on the p-cladding layer and covers at least regions between the cells to protect a surface of the p-cladding layer; and a transparent conducting layer formed on the surface protective layer and the grid cell layer using a transparent conducting material.

The grid cell layer may be formed from materials in at least one layer using at least one material selected from the group consisting of nickel (Ni), cobalt (Co), copper (Cu), palladium (Pd), platinum (Pt), ruthenium (Ru), iridium (Ir), gold (Au), silver (Ag), chromium (Cr), rhodium (Rh), indium (In), tin (Sn), magnesium (Mg), zinc (Zn), beryllium (Be), strontium (Sr), barium (Ba), and an alloy or solid solution containing the above elements. The grid cell layer may be formed to a thickness of 1 to 100 nanometers (nm).

The surface protective layer is formed in at least one layer using at least one material selected from the group consisting of Ag, Ni, Au, Ru, Pt, Pd, Rh, Ir, Zn, Mg, Cr, Cu, Co, In, Sn, lanthanide series elements, an alloy or solid solution composed of two or more of the above metals, and a transition metal nitride. It may be formed to a thickness of less than 20 nm.

The transparent conducting layer is formed from a transparent conducting oxide (TCO) coprising oxygen (O) and at least one element selected from the group consisting of In, Sn, Zn, Ga, cadmium (Cd), Mg, Be, Ag, Molybdenum (Mo), vanadium (V), Cu, Ir, Rh, Ru, tungsten (W), Co, Ni, manganese (Mn), Al, and lanthanide series of metals. Alternatively, the transparent conductive layer may be formed from a transparent conducting nitride (N) containing titanium (Ti) and nitrogen (N). Furthermore, the transparent conducting layer may contain at least one dopant element among metals on the periodic table in addition to the TCO or TCN in order to adjust the electrical characteristics of the TCO or TCN. The transparent conducting layer may be formed to a thickness of 10 to 1,000 nm.

According to another aspect of the present invention, there is provided a method of manufacturing a top-emitting nitride-based light-emitting device with an active layer between n- and p-type cladding layers, the method including the steps of: (a) forming a grid cell layer on the p-cladding layer in a light-emitting structure including a substrate, and the n-cladding layer, the active layer, and the p-cladding layer sequentially formed on the substrate, the grid cell layer comprising a grid array of separated cells formed from a conducting material with a width of less than 30 micrometers; (b) forming a surface protective layer on the p-cladding layer to cover at least regions between the cells and protect a surface of the p-cladding layer; and (c) forming a transparent conducting layer on the surface protective layer and the grid cell layer using a transparent conducting material.

In the step (a), a thermal dispersion method is used to apply heat to the conducting material formed on the p-cladding layer so that the conducting material is separated into individual cells. Alternatively, a shadow mask is used to deposit the grid cell layer.

A p-electrode structure formed after the step (c) may be annealed over the temperature range of room temperature to 800° C. for 10 seconds to 3 hours. The annealing is performed within a reactor incorporating a light-emitting device having the p-electrode structure in vacuum or gas ambient containing at least one of $N_2$, argon (Ar), helium (He), $O_2$, hydrogen ($H_2$), and air.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF THE PREFERRED EMBODIMENTS

A top-emitting nitride-based light-emitting device and a method of fabricating the same according to preferred embodiments of the present invention will now be described more fully with reference to the accompanying drawings.

Figure 1:
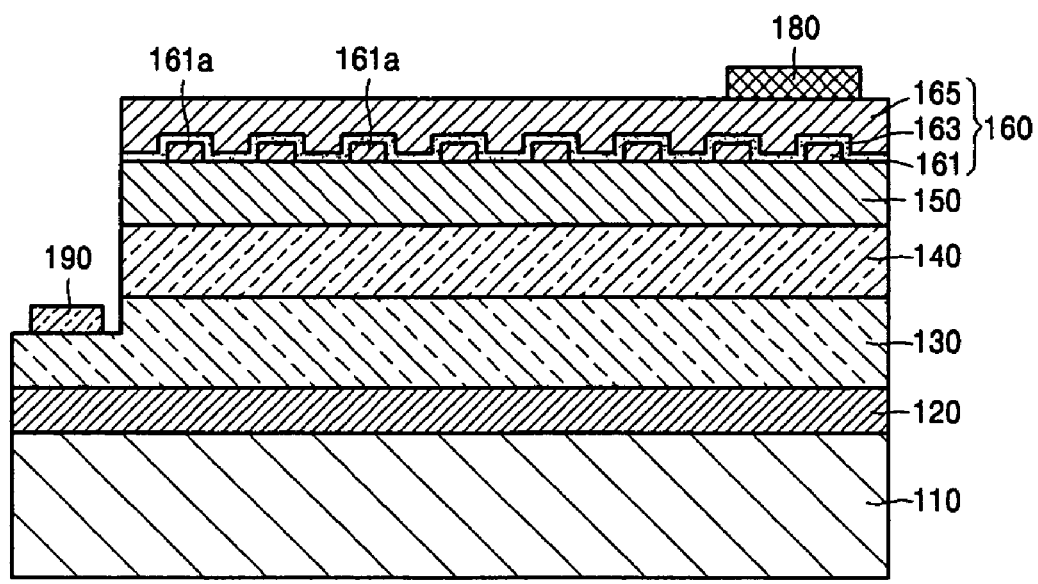
FIG. 1 is a top-emitting light-emitting device according to an embodiment of the present invention.

Referring to FIG. 1, a top-emitting light-emitting device according to a first embodiment of the present invention includes a substrate 110, and a buffer layer 120, an n-cladding layer 130, an active layer 140, a p-cladding layer 150 and a transparent multilayer ohmic contact 160 sequentially formed on the substrate 110. The top-emitting light-emitting device further includes a p-electrode pad 180 and an n-electrode pad 190.

The top-emitting light-emitting device is mainly divided into a light-emitting structure including the substrate 110, the buffer layer 120, the n-cladding layer 130, the active layer 140, and the p-cladding layer 150 and a p-electrode structure including the transparent multilayer ohmic contact 160 formed on the p-cladding layer 150. The substrate 110 may be formed from sapphire, silicon carbide (SiC), Si, or gallium arsenide (GaAs). Optionally, the buffer layer 120 may not be formed.

Each of the layers from the buffer layer 120 up to the p-cladding layer 150 includes a compound selected from among III-nitride-based compounds represented by the general formula $Al_xIn_yGa_zN$ ($0 \leq x \leq 1$, $0 \leq y \leq 1$, $0 \leq z \leq 1$, and $0 \leq x+y+z \leq 1$) as its main component, and the n- and p-cladding layers 130 and 150 contain appropriate dopants in addition to the compounds. The active layer 140 may be formed as a single layer or a multiquantum well (MQW) layer, or have other commonly known structures.

For example, when each layer is mainly made from a GaN-based compound, the buffer layer 120 is made of GaN, the n-cladding layer 130 contains an n-type dopant such as Si, germanium (Ge), selenium (Se), or tellurium (Te) in addition to GaN, the active layer 140 has an indium gallium nitride (InGaN)/GaN MQW or aluminum gallium nitride (AlGaN)/GaN MQW structure, and the p-cladding layer 150 contains a p-type dopant such as magnesium (Mg), zinc (Zn), calcium (Ca), strontium (Sr), or barium (Ba) in addition to GaN.

An n-ohmic contact layer (not shown) may be interposed between the n-cladding layer 130 and the n-electrode pad 190 and composed of a titanium (Ti)/Al bilayer or other various known compositions. The p-electrode pad 180 may be composed of a Ni/Au or silver (Ag)/Au bilayer.

Each layer may be formed using commonly known deposition techniques such as an electron-beam (e-beam) evaporator, physical vapor deposition (PVD), chemical vapor deposition (CVD), pulsed laser deposition (PLD), dual-type thermal evaporator, or sputtering.

Transparent multilayer ohmic contact 160 serves as a p-electrode and is composed of a grid cell layer 161, a surface protective layer 163, and a transparent conducting layer 165.

The grid cell layer 161 comprises a grid array of cells 161a separated from one another. Each cell 161a preferably has a width less than 30 micrometers (pm), more preferably, less than several nanometers (nm). Each cell 161a is formed from conducting or gallide-forming materials such as at least one material selected from the group consisting of Ni, cobalt (Co), copper (Cu), palladium (Pd), platinum (Pt), ruthenium (Ru), iridium (Ir), Au, Ag, chromium (Cr), rhodium (Rh), In, tin (Sn), Mg, Zn, beryllium (Be), Sr, Ba, and an alloy or solid solution composed of two or more of the above elements. Each cell 161a may be formed in a single layer or multilayers of different materials.

The grid cell layer 161 causes an inhomogeneous Schottky barrier effect, thereby improving carrier injection, current spreading, and conductivity of the p-electrode. The grid cell layer 161 is formed using a thermal dispersion method in which heat is applied to a target conducting material formed on the p-cladding layer 150 so that the conducting material is separated to form island-like structures. Alternatively, the grid cell layer 161 may be deposited and patterned on the p-cladding layer 150 using a shadow masking technique.

Figure 2:
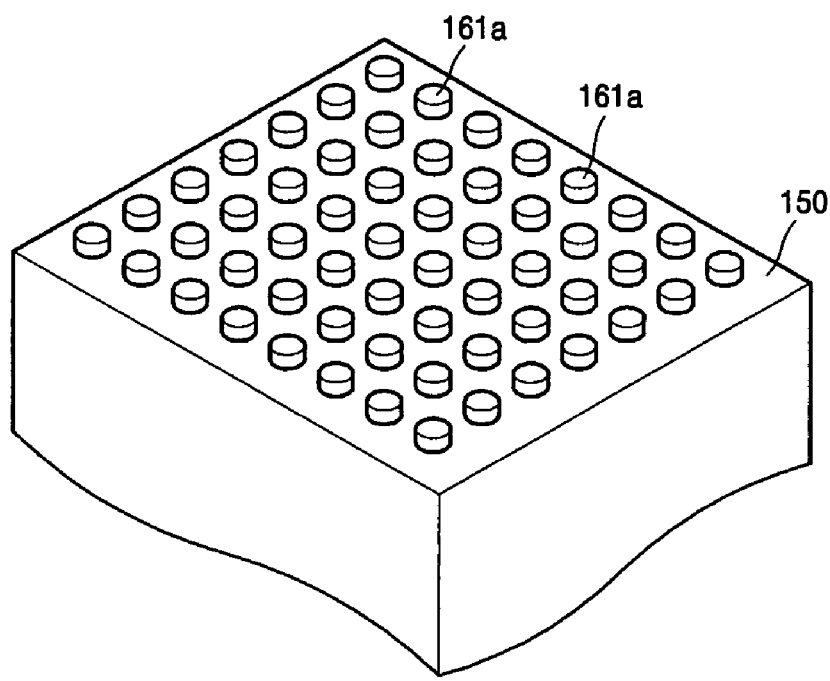
FIG. 2 is a partial perspective view showing a regular arrangement of cells in the grid cell layer shown in FIG. 1.

The grid cell layer 161 may be formed to a thickness of 1 to 100 nm so that the cells 161a are kept small and as distant from one another as possible. While being circular in shape as shown in FIG. 2, the cells 161a may have various other shapes such as elliptical or polygonal cells.

The surface protective layer 163 is used to prevent damage to the surface of the p-cladding layer 150 during sputtering while suppressing formation of insulating oxide such as gallium oxide ($Ga_2O_3$) or magnesium oxide (MgO), thus improving electrical characteristics of the p-electrode structure. The surface protective layer 163 is made from a material with high electrical conductivity and which can be easily decomposed into conducting nano-phase particles during annealing at a temperature below 600° C. in various ambients, giving high light transmittance. The surface protective layer 163 may be formed from at least one material selected from the group consisting of Ag, Ni, Au, Ru, Pt, Pd, Rh, Ir, Zn, Mg, Cr, Cu, Co, In, Sn, lanthanide series elements, an alloy or solid solution composed of two or more of the above metals, and transition metal nitride.

The surface protective layer 163 may also be formed in multilayers of different materials. In the illustrated embodiment, the surface protective layer 163 is formed to an appropriate thickness, preferably, less than 20 nm to cover upper portions of the cells 161a and regions between the cells 161a. The transparent conducting layer 165 is formed using transparent conducting oxide (TCO) or transparent conducting nitride (TCN).

The TCO comprises oxygen (O) and at least one element selected from the group consisting of In, Sn, Zn, Ga, cadmium (Cd), Mg, Be, Ag, Molybdenum (Mo), vanadium (V), Cu, Ir, Rh, Ru, tungsten (W), Co, Ni, manganese (Mn), Al, and lanthanide series elements. The TCO material is selected by considering work function and sheet resistance. The TCN may be TiN containing nitrogen (N) and Ti with low sheet resistance and high light transmittance.

Furthermore, the transparent conducting layer 165 may contain at least one dopant element among metals on the periodic table in addition to the TCO or TCN in order to improve the electrical characteristics of the TCO or TCN. The amount of dopant added may be in the range of 0.001 to 20 weight percent (weight %) to achieve appropriate electrical characteristics of the TCO or TCN. Here, weight % refers to the percent of weight of each element in the compound. The transparent conducting layer 165 may be formed to a thickness of 10 to 1,000 nm to provide proper light transmittance and electrical conductivity.

The transparent multilayer ohmic contact 160 comprises the grid cell layer 161, the surface protective layer 163, and the transparent conducting layer 165 formed using the above-mentioned materials on the p-cladding layer 150 in the light-emitting structure including the substrate 110, and the n-cladding layer 130, the active layer 140 and the p-cladding layer 150 sequentially formed on the substrate 110.

The transparent multilayer ohmic contact 160 may be formed using at least one of the following selected from the group consisting of an e-beam evaporator, a thermal evaporator, sputtering deposition, and PLD. A deposition temperature ranges from 20 to 1,500° C. and the pressure within an evaporator ranges from atmospheric pressure to about 10-12 Torr. After deposition, the transparent multilayer ohmic contact 160 may be annealed at 100 to 800° C. within a reactor in vacuum or various gas ambients for 10 seconds to 3 hours. At least one of $N_2$, argon (Ar), helium (He), $O_2$, hydrogen ($H_2$), and air may be injected into the reactor during annealing.

Figure 3:
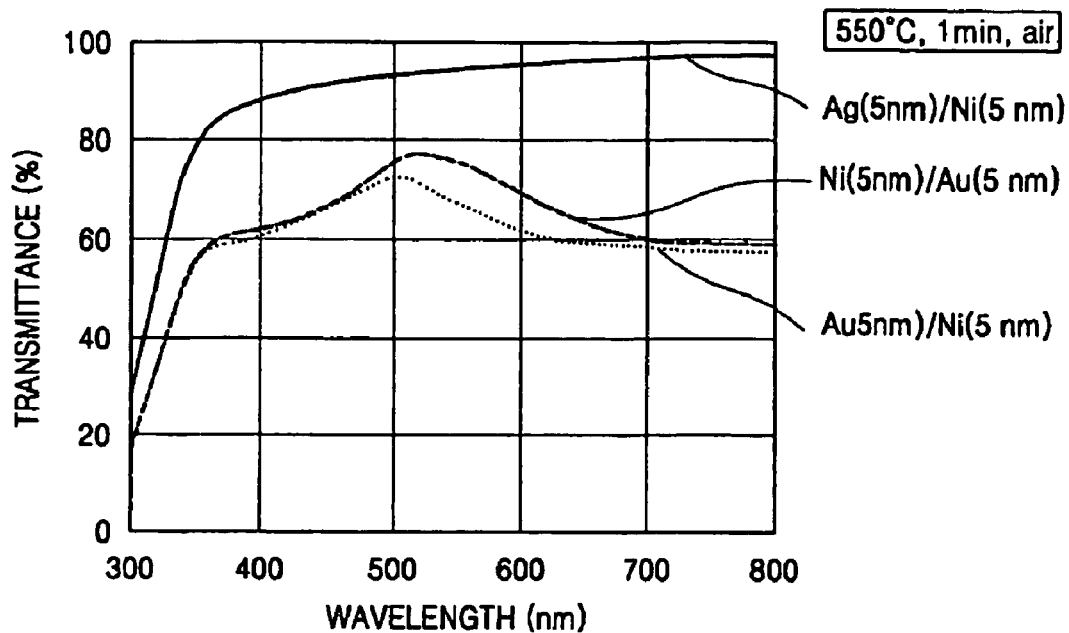
FIG. 3 is a graph showing comparison between measurements of light transmittance made on a light-emitting device according to the present invention and a conventional light-emitting device having a Ni/Au ohmic contact layer.

FIG. 3 is a graph showing comparison between measurements of light transmittance made on a light-emitting device according to the present invention and a conventional light-emitting device having a Ni/Au ohmic contact layer. A solid curve on the graph represents light transmittance obtained by annealing a light-emitting device with a p-electrode structure according to a first embodiment of the present invention at 530° C. The p-electrode structure comprises the grid cell layer 161 composed of a regular grid array of Au particles with a size of 20 μm on the p-cladding layer 150, the surface protective layer 163 formed by sequentially depositing Ag (5 nm) and Ni (5 nm), and the transparent conducting layer 165 made of ITO with a thickness of 100 nm.

A curve with dash marks on the graph represents light transmittance obtained by annealing a light-emitting device with a p-electrode structure according to a second embodiment of the present invention at 530° C. The p-electrode structure comprises the grid cell layer 161 composed of a regular grid array of Au particles with a size of 20 μm on the p-cladding layer 150, the surface protective layer 163 formed by sequentially depositing Ni (5 nm) and Au (5 nm), and the transparent conducting layer 165 made of ITO with a thickness of 100 nm.

A curve with dot marks represents light transmittance obtained by annealing a light-emitting device with a conventional p-electrode structure formed by sequentially depositing Au (5 nm) and Ni (5 nm) on the p-cladding layer 150 at 530° C.

As evident from FIG. 3, the light-emitting devices according to the present invention exhibit improved light transmittances over the conventional light-emitting device. Furthermore, the light-emitting devices according to the present invention have different light transmittances depending on materials of the surface protective layer 163.

Figure 4:
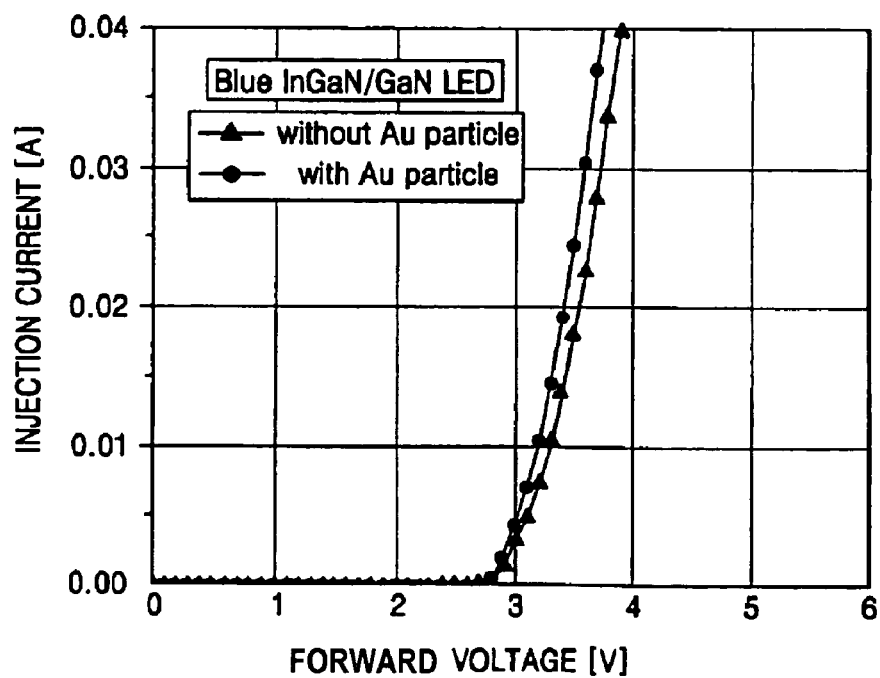
FIG. 4 is a graph illustrating current-voltage (I-V) characteristics measured on a light-emitting diode (LED) with a grid cell layer according to the present invention and a LED without the grid cell layer.

FIG. 4 is a graph illustrating current-voltage (I-V) characteristics measured on a blue InGaN/GaN LED with the grid cell layer 161 formed on the p-cladding layer 150 to a thickness of 10 nm by regularly arranging Au particles with a size of 20 μm according to an embodiment of the present invention and a blue InGaN/GaN LED without the grid cell layer 161. The blue InGaN/GaN LED without the grid cell layer 161 includes a p-electrode comprising the surface protective layer 163 formed by sequentially depositing Ni (3 nm) and Ag (3 nm) and the transparent conducting layer 165 made of ITO. Measurements were made after annealing the LEDs.

As evident from FIG. 4, the LED with the grid cell layer 161 composed of a regular grid array of Au particles exhibit superior electrical characteristics over the LED without the grid cell layer 161.

As can be seen in FIGS. 3 and 4, a light-emitting device with a p-electrode structure according to embodiments of the present invention increases effective hole concentration on the surface of the p-cladding layer 150 by forming a gallide between the p-cladding layer 150 and the surface protective layer 163 while providing high light transmittance and low sheet resistance less than 20 Ω/cm².

Based on the foregoing, a top-emitting nitride-based light-emitting device and a method of manufacturing the same provide an improved ohmic contact to a p-cladding layer, excellent I-V characteristics, and high light transmittance, thus increasing luminous efficiency of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A top-emitting nitride-based light-emitting device with an active layer between n- and p-type cladding layers, the device comprising:
   a grid cell layer formed on the p-type cladding layer, the grid cell layer comprising a grid array of separated cells formed from a conducting material, each of the cells having a width of less than 30 micrometers;
   a metallic surface protective layer that is formed directly on the p-type cladding layer and the grid cell layer and covers at least all upper regions of the p-type cladding layer between the cells to provide protection to a surface of the p-cladding layer;
   a transparent conducting layer formed on the surface protective layer and the grid cell layer using a transparent conducting material,
   wherein the metallic surface protective layer is formed in multiple layers of different material, wherein at least one layer comprises silver and at least one layer comprises nickel;
   wherein the grid cell layer is formed in multiple layers of different materials; where the conducting material is annealed at a temperature from 100 to 800° C. and wherein the nitride-based light-emitting device shows a percentage transmittance of greater than 80% for light having wavelengths of 400 to 800 nanometers; wherein the transparent conducting layer is made from one of a transparent conducting oxide and a transparent conducting nitride; and
   wherein the transparent conducting nitride contains titanium nitride containing nitrogen and titanium.

2. The device of claim 1, wherein the grid cell layer is formed from materials in at least one layer using at least one material selected from the group consisting of nickel, cobalt, copper, palladium, platinum, ruthenium, iridium, gold, silver, chromium, rhodium, indium, tin, magnesium, zinc, beryllium, strontium, barium, an alloy containing at least two of the above elements, and a solid solution containing at least two of the above elements.

3. The device of claim 1, wherein the surface protective layer is formed in at least one layer using at least one material selected from the group consisting of silver, nickel, gold, ruthenium, platinum, palladium, rhodium, iridium, zinc, magnesium, chromium, copper, cobalt, indium, tin, lanthanide series elements, an alloy or solid solution containing at least two of the above metals, and a transition metal nitride.

4. The device of claim 1, wherein the grid cell layer is formed to a thickness of 1 to 100 nanometers.

5. The device of claim 1, wherein the surface protective layer is formed to a thickness of less than 20 nanometers.

6. The device of claim 1, wherein the transparent conducting layer is formed to a thickness of 10 to 1,000 nanometers.

7. The device of claim 1, wherein the transparent conducting layer contains at least one dopant element among metals on a periodic table.

8. The device of claim 7, wherein an amount of the dopant added is in a range substantially between 0.001 and 20 weight percent.

9. The device of claim 1, wherein the transparent conducting layer contains at least one dopant element among metals on a periodic table added to the one of the transparent conducting oxide and the transparent conducting nitride.

10. The device of claim 9, wherein an amount of the dopant added is in a range substantially between 0.001 and 20 weight percent of the one of the transparent conducting oxide and the transparent conducting nitride.

11. The device of claim 1, wherein the separated cells are formed of gold particles each having a size of approximately 20 micrometers on the p-type cladding layer.

12. The device of claim 1, wherein the grid cell layer, the surface protective layer and the transparent conducting layer form a transparent ohmic contact constituting a p-electrode formed on the p-type cladding layer.

13. The device of claim 12, wherein the p-electrode is transparent.

14. The device of claim 12, wherein the surface protective layer formed on the p-type cladding layer and the grid cell layer is configured to prevent damage to a surface of the p-type cladding layer on which the surface protective layer is formed, and suppress formation of an insulating oxide in the p-electrode.

* * * * *